(12) United States Patent
Huang

(10) Patent No.: US 11,532,644 B2
(45) Date of Patent: Dec. 20, 2022

(54) DISPLAY PANEL AND DISPLAY DEVICE APPLYING THE SAME

(71) Applicant: HKC CORPORATION LIMITED, Guangdong (CN)

(72) Inventor: Beizhou Huang, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 275 days.

(21) Appl. No.: 16/758,167

(22) PCT Filed: Dec. 13, 2017

(86) PCT No.: PCT/CN2017/115850
§ 371 (c)(1),
(2) Date: Apr. 22, 2020

(87) PCT Pub. No.: WO2019/080291
PCT Pub. Date: May 2, 2019

(65) Prior Publication Data
US 2021/0074733 A1    Mar. 11, 2021

(30) Foreign Application Priority Data

Oct. 26, 2017  (CN) .......................... 201711016871.2

(51) Int. Cl.
*H01L 27/12*      (2006.01)
*H01L 23/498*     (2006.01)
(Continued)

(52) U.S. Cl.
CPC ...... *H01L 27/124* (2013.01); *H01L 23/49838* (2013.01); *G02F 1/13452* (2013.01);
(Continued)

(58) Field of Classification Search
CPC ............. H01L 27/124; H01L 23/49838; H01L 23/4985; H01L 27/3276; G02F 1/13452;
(Continued)

(56) References Cited

U.S. PATENT DOCUMENTS

2006/0146112 A1      7/2006  Kim et al.
2014/0085173 A1*     3/2014  Dong .................. G02F 1/13452
                                                                 345/87
2016/0056178 A1*     2/2016  Ma ...................... H01L 27/1262
                                                                 257/72

FOREIGN PATENT DOCUMENTS

CN         1484067 A       3/2004
CN         1844977 A      10/2006
(Continued)

*Primary Examiner* — Benjamin Tzu-Hung Liu
(74) *Attorney, Agent, or Firm* — Muncy, Geissler, Olds & Lowe, P.C.

(57) ABSTRACT

A display panel and a display device are provided. The display panel includes: a first substrate including a display area and a wiring area, wherein active switches and pixel units are disposed in the display area, and the pixel units couple to the active switches; a second substrate disposed opposite the first substrate; a first drive line portion disposed in the wiring area and including first circuit leads; a second drive line portion disposed in the wiring area and including second circuit leads; a first interface unit connected to the first circuit leads; and a virtual bit interface unit connected to the second circuit leads. The first drive line portion is mounted around the second drive line portion, and the first interface unit is connected to the virtual bit interface unit, so the second drive line portion is coupled to the first drive line portion to form parallel circuits.

18 Claims, 12 Drawing Sheets

(51) Int. Cl.
  *G02F 1/1345* (2006.01)
  *G09G 3/36* (2006.01)
  *H01L 27/32* (2006.01)
(52) U.S. Cl.
  CPC ......... *G09G 3/3677* (2013.01); *G09G 3/3688* (2013.01); *H01L 23/4985* (2013.01); *H01L 27/3276* (2013.01)
(58) Field of Classification Search
  CPC ............... G09G 3/3677; G09G 3/3688; G09G 2300/0426
  See application file for complete search history.

(56) References Cited

FOREIGN PATENT DOCUMENTS

| | | |
|---|---|---|
| CN | 104216182 A | 12/2014 |
| CN | 107065332 A | 8/2017 |
| CN | 107111971 A | 8/2017 |

\* cited by examiner

DISPLAY PANEL AND DISPLAY DEVICE APPLYING THE SAME

BACKGROUND

Technical Field

This disclosure relates to a circuit structure of a display, and more particularly to a wire on array (WOA) of a display panel and a display device applying the same.

Related Art

Recently, liquid crystal displays (LCDs) have the wide applications. With the improvement of the driving technology, the LCD has advantages of the low electrical power consumption, the thin and light properties, the low voltage driving property and the like. At present, the LCD has been widely applied to the video recorder/player, notebook computer, desktop display and various projection apparatuses.

When the panel of the active switch-liquid crystal display (or TFT-LCD) is normally displaying, a gate driver needs to be combined with a gate line, a source driver needs to be combined with a data line and to work in conjunction with a color filter common electrode (CF Com) and a storage electrode. A pixel electrode signal is supplied through the data line after the active switch (TFT) turns on. A storage electrode signal is supplied from an array common line (AA Com) around an effective display area to form a storage capacitor (Cst) between it and the pixel electrode. A color filter common electrode signal is supplied from a common voltage line of the wire on array (WOA) of the array substrate to the color filter substrate. A liquid crystal capacitor (Clc) is formed between the color filter common electrode and the pixel electrode.

In order to save the cost, the circuits including the gate driver, the gate lines and the data lines are formed on the same display substrate, and then the WOA is utilized to connect the display substrate to the chip on film (COF) for transmitting the gate drive signal. In general, the WOA includes: the type A trace for providing the common voltage to the color filter substrate; the type B trace for providing the power drive signal to the chip; and the type C trace for providing the work signal to the chip. However, a signal of the gate line is transferred to each layer of chip and integrated circuit (IC) in a layer-by-layer manner through the WOA. Thus, the power drive signal provided to the chip/integrated circuit through the type B trace cannot have the serious distortion. In the design, the resistance value of the type B trace for the chips/integrated circuits needs to be decreased.

However, with the requirement of the border of the display panel getting narrower and narrower, the WOA space is getting smaller and smaller, and this also makes the wiring spaces of the drive traces of the chips/integrated circuits become smaller and smaller, and the trace is getting thinner and thinner and longer and longer. The corresponding impedance value gets larger. Not only the drive signal gets distorted seriously, but also the display homogeneity of the display panel is affected.

SUMMARY

In order to solve the above-mentioned technical problems, an objective of this disclosure is to provide a wire on array (WOA) structure capable of decreasing the resistance value of the type B trace of the WOA in the narrow border, enhancing the product quality and the product reliability, and lengthening the lifetime.

The objective of this disclosure and the solution of the technical problem can be implemented by the following technical solutions. This disclosure provides a display panel includes: a first substrate including a display area and a wiring area, wherein a plurality of active switches and a plurality of pixel units are disposed in the display area of the first substrate, and the pixel units are respectively coupled to the active switches; a second substrate disposed opposite the first substrate; a first drive line portion disposed in the wiring area of the first substrate, wherein the first drive line portion comprises a plurality of first circuit leads; a second drive line portion disposed in the wiring area of the first substrate, wherein the second drive line portion comprises a plurality of second circuit leads; a first interface unit respectively connected to the first circuit leads; and a virtual bit interface unit respectively connected to the second circuit leads. The first drive line portion is mounted around the second drive line portion, and the first interface unit is connected to the virtual bit interface unit, so that the second drive line portion is electrically coupled to the first drive line portion to form parallel circuits.

This disclosure further includes the following technical solutions for solving the technical problem.

In one embodiment of the disclosure, the first interface unit is disposed by way of single-layer metal wiring or dual-layer metal wiring.

In one embodiment of the disclosure, the virtual bit interface unit is disposed by way of single-layer metal wiring or dual-layer metal wiring.

In one embodiment of the disclosure, the display panel further includes a third drive line portion, and the third drive line portion is respectively electrically coupled to a plurality of virtual bit interface units and the first interface unit.

In one embodiment of the disclosure, the third drive line portion is disposed by way of single-layer metal wiring or dual-layer metal wiring.

In one embodiment of the disclosure, the first circuit leads are connected to a drive chip.

In one embodiment of the disclosure, the drive chip is a source drive chip.

In one embodiment of the disclosure, the drive chip is a gate drive chip.

In one embodiment of the disclosure, the display panel further includes: a fourth drive line portion disposed in the wiring area of the first substrate; and a flexible circuit board including a first wire, wherein the first wire is electrically coupled to the first drive line portion and the fourth drive line portion.

In one embodiment of the disclosure, the flexible circuit board further includes a second wire, and the second wire and the first wire are connected in parallel to form parallel wires.

In one embodiment of the disclosure, the flexible circuit board is a flexible printed circuit film or a flexible printed circuit board.

In one embodiment of the disclosure, the display panel further includes: a fourth drive line portion disposed in the wiring area of the first substrate, wherein the first interface unit connects the first drive line portion to the third drive line portion; and a flexible circuit board including a first wire and a second wire, wherein the second wire and the first wire are connected in parallel to form parallel wires, and the first drive line portion is electrically coupled to the fourth drive line portion through the first wire.

In one embodiment of the disclosure, the display panel further includes: a fourth drive line portion disposed in the wiring area of the first substrate; and a flexible circuit board including a first wire and a second wire, wherein the second wire and the first wire are connected in parallel to form parallel wires, the first interface unit electrically couples the first drive line portion and the fourth drive line portion to the virtual bit interface units, and the second drive line portion is respectively electrically coupled to the virtual bit interface units to respectively form parallel circuits together with the first drive line portion and the fourth drive line portion.

In one embodiment of the disclosure, the display panel further includes: a fourth drive line portion disposed in the wiring area of the first substrate; and a flexible circuit board including a first wire and a second wire, wherein the second wire and the first wire are connected in parallel to form parallel wires, the first wire is respectively connected to the first drive line portion and the fourth drive line portion, the first drive line portion and the fourth drive line portion are respectively electrically coupled to the third drive line portion and the virtual bit interface units through the first interface unit, the second drive line portion is respectively electrically coupled to the virtual bit interface units to respectively form parallel circuits together with the first drive line portion and the fourth drive line portion, and the third drive line portion is disposed between the virtual bit interface units.

In one embodiment of the disclosure, an edge of the second drive line portion has an active switch array.

The disclosure also provides a display panel, including: a first substrate including a display area and a wiring area, wherein a plurality of active switches and a plurality of pixel units are disposed in a display area of the first substrate, and the pixel units are respectively coupled to the active switches; a second substrate disposed opposite the first substrate; a first drive line portion disposed in the wiring area of the first substrate, wherein the first drive line portion comprises a plurality of first circuit leads; a second drive line portion disposed in the wiring area of the first substrate, wherein the second drive line portion comprises a plurality of second circuit leads; a first interface unit respectively connected to the first circuit leads; and a virtual bit interface unit respectively connected to the second circuit leads. The first drive line portion is mounted around the second drive line portion, the first circuit leads and the second circuit leads are extendingly disposed in a same direction toward an edge of the first substrate, and the first interface unit is electrically coupled to the virtual bit interface unit, so that the first drive line portion and the second drive line portion form parallel circuits. An edge of the second substrate is disposed between the first drive line portion and the first interface unit and disposed between the second drive line portion and the virtual bit interface unit. The first drive line portion further comprises a first pair of bit marks to be connected to the first circuit leads. The second drive line portion further comprises a second pair of bit marks to be connected to the second circuit leads. An edge of the second drive line portion has an active switch array. The first interface unit and the virtual bit interface unit are electrically coupled to the first drive line portion by way of single-layer or dual-layer metal wiring.

In one embodiment of the disclosure, materials of the first pair of bit marks and the second pair of bit marks are selected from a group consisting of aluminum, molybdenum, chromium and alloys of aluminum, molybdenum and chromium.

In one embodiment of the disclosure, materials of the first interface unit and the virtual bit interface unit are selected from a group consisting of aluminum, molybdenum, chromium and alloys of aluminum, molybdenum and chromium.

This disclosure further provides a display device, comprising a control component and a display panel connected to the control component. The display panel includes: a first substrate including a display area and a wiring area, wherein a plurality of active switches and a plurality of pixel units are disposed in the display area of the first substrate, and the pixel units are respectively coupled to the active switches; a second substrate disposed opposite the first substrate; a first drive line portion disposed in the wiring area of the first substrate, wherein the first drive line portion comprises a plurality of first circuit leads; a second drive line portion disposed in the wiring area of the first substrate, wherein the second drive line portion comprises a plurality of second circuit leads; a first interface unit respectively connected to the first circuit leads; and a virtual bit interface unit respectively connected to the second circuit leads. The first drive line portion is mounted around the second drive line portion, and the first interface unit is connected to the virtual bit interface unit, so that the second drive line portion is electrically coupled to the first drive line portion to form parallel circuits.

This disclosure can decrease the resistance value of the type B trace of the WOA in the narrow border, enhance the product quality and the product reliability, and lengthen the lifetime.

DETAILED DESCRIPTION OF THE INVENTION

Figure 1A:
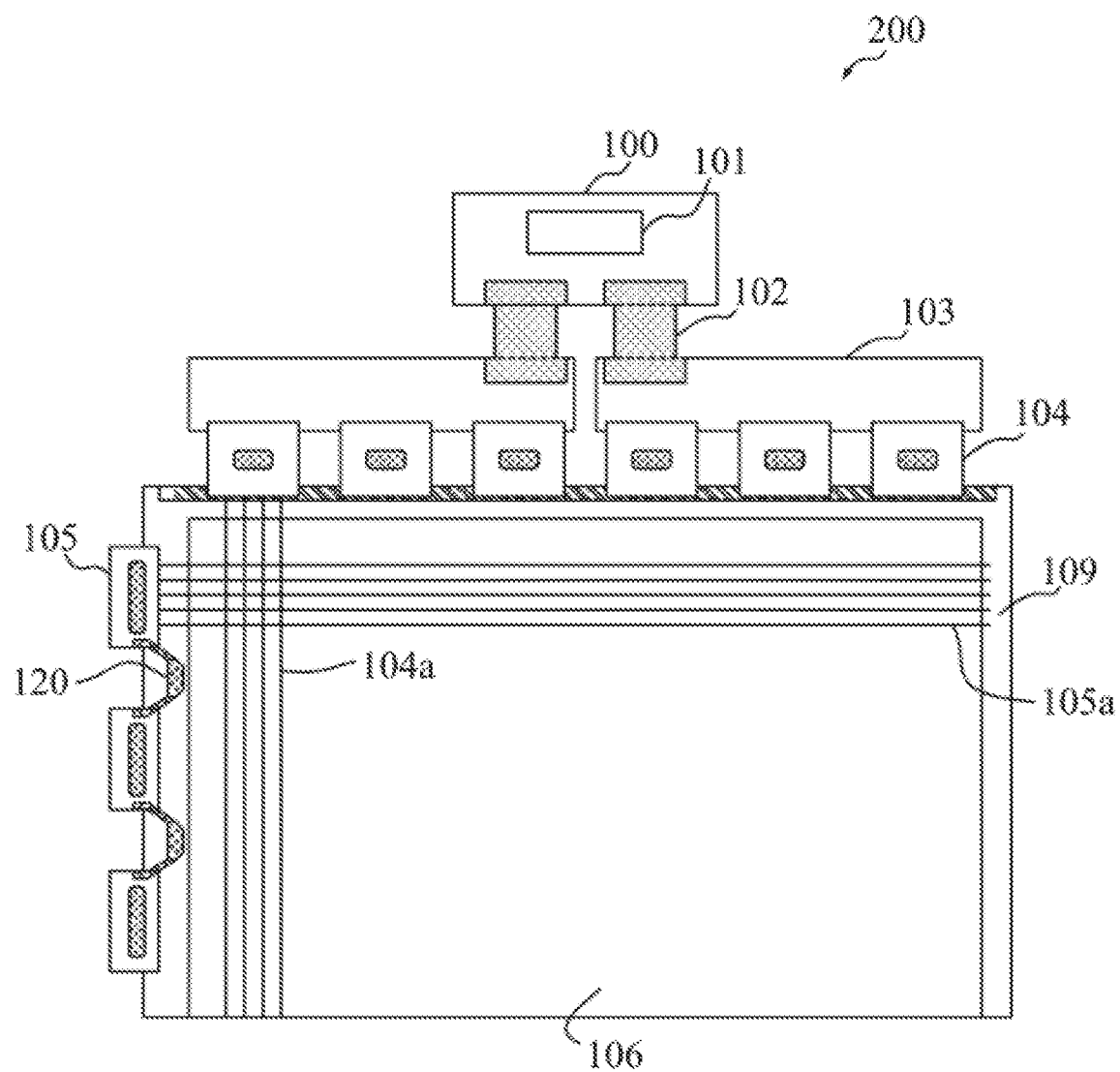
FIG. 1a is a schematic architecture view showing an exemplary display device.

In the description of this disclosure, it is to be understood that the terms "up", "down", "front", "back", "left", "right", "vertical", "horizontal", "top", "bottom", "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure.

In the drawings, the thickness of layers, films, panels, areas and the line are exaggerated for clarity. In the drawings, the thickness of some layers and areas is exaggerated for clarity and ease of description. It will be understood that when an element such as a layer, film, area or substrate is referred to as being "on" another element, the same may be directly on the other element, or intervening elements may also be present.

Also, in the specification, unless explicitly described to the contrary, the word "including" will be understood to mean encompassing the element, but not excluding any other element. In addition, in the specification, "on" means above or below a target group component, but does not mean that it must be on a top based on the direction of gravitational force.

In order to further illustrate the technical means and effects of this disclosure in order to achieve the intended purpose of this invention, the specific embodiment, structure, characteristic and effect of a display panel and display device applying the same according to this disclosure will be described in the following with reference to the accompanying drawings and embodiments.

FIG. 1a is a schematic architecture view showing an exemplary display device. Referring to FIG. 1a, a display device 200 includes: a control board 100, which includes a timing controller (TCON) 101; a printed circuit board 103 connected to the control board 100 through a flexible flat cable (FFC) 102; a source driving unit 104 and a gate driving unit 105, which are disposed in a wiring area 109 and connected to a data line 104a and a gate line 105a inside a display area 106, respectively. In some embodiments, the gate driving unit 105 and the source driving unit 104 include, but without limitation to, a COF form.

The drive mode of the display device 200 includes providing, by a system mainboard, a color (such as R/G/B) compression signal, a control signal and a power transmitted to the control board 100. After the timing controller (TCON) 101 on the control board 100 processes these signals, the processed signals are transmitted to the gate driving unit 105 and the source driving unit 104 of the printed circuit board 103 together with the power processed by the drive circuit through the FFC 102. The gate driving unit 105 and the source driving unit 104 transmit the necessary data and power to the display area 106, so that the display device 200 obtains the power and the signal required for displaying the frame.

Figure 1B:
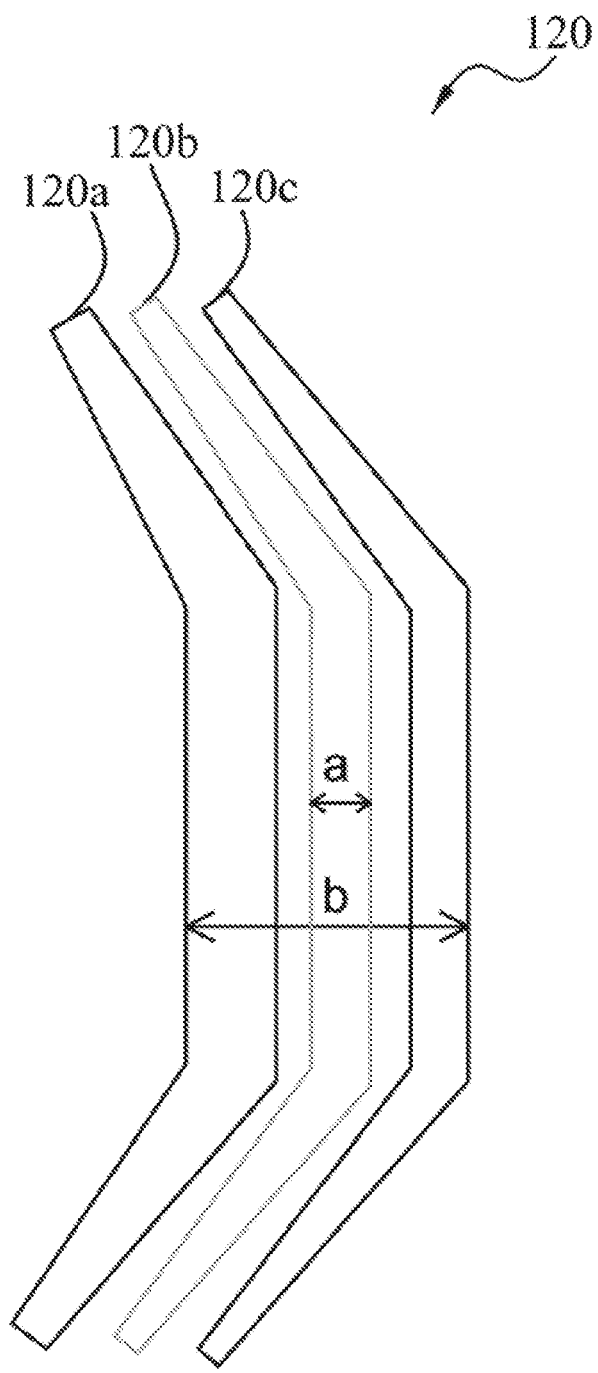
FIG. 1b is a schematic trace view showing an exemplary wire array.

FIG. 1b is a schematic trace view showing an exemplary wire array. The understanding is facilitated with reference to FIG. 1b in view of FIG. 1a. In some embodiments, the circuits, such as the driving units (104, 105), the gate line 105a and the data line 104a and the like, are formed on the same display substrate. The display substrate and the driving units (104, 105) for transmitting the drive signal are connected together by using the WOA 120. In general, the WOA 120 includes: a type A trace 120a for transmitting the common voltage; a type B trace 120b for supplying a power drive signal to a chip; and a type C trace 120c for supplying a work signal to the chip.

Figure 1C:
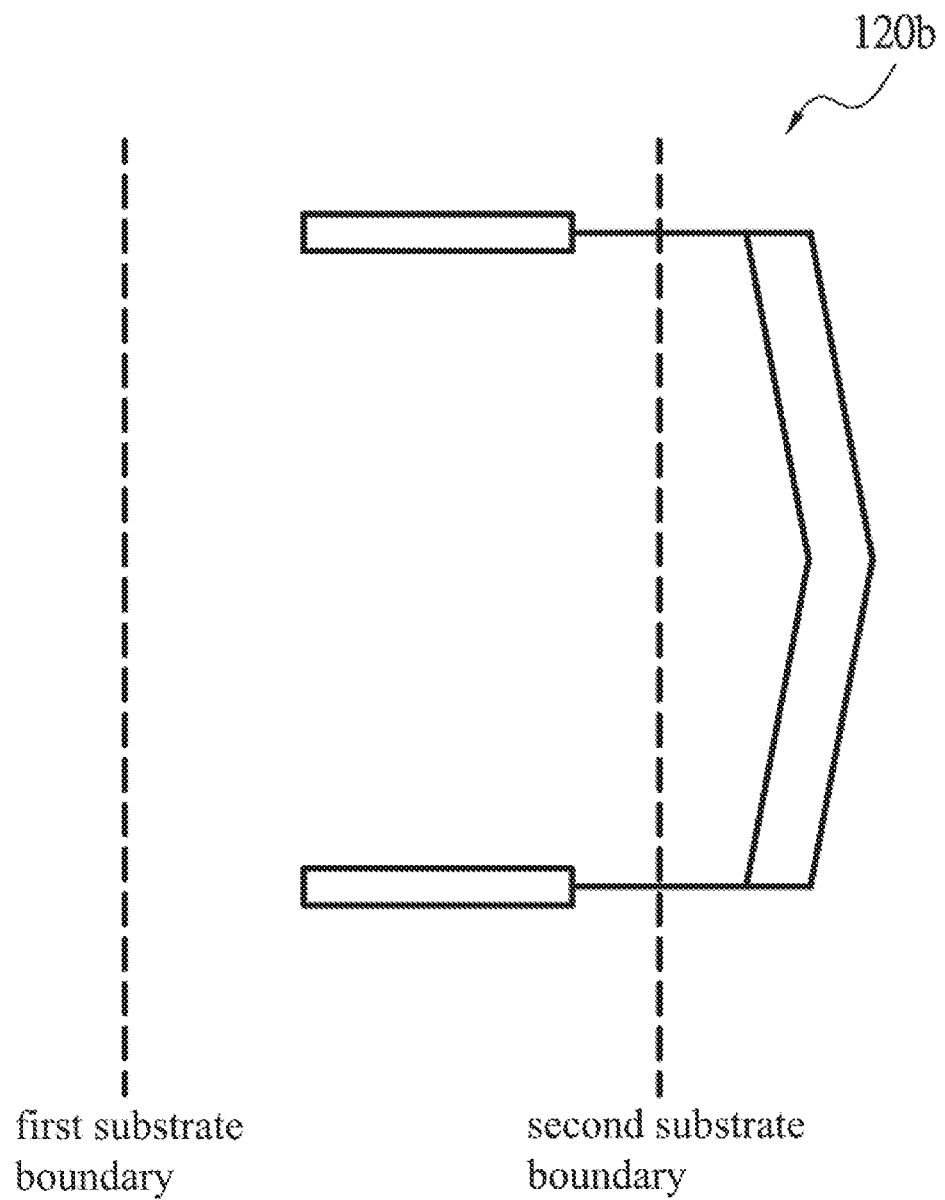
FIG. 1c is a schematic view showing the type B trace in the exemplary wire array.

FIG. 1c is a schematic view showing the type B trace in the exemplary wire array. Please refer to FIG. 1c, which shows the WOA structure (type B trace 120b) of the exemplary display panel, which has a plurality of drive line portions (type B traces 120b), and each of the drive line portions includes a plurality of circuit leads and interface units.

However, a signal of the gate line 105a is transferred to each layer of the chip and integrated circuit (IC) of the gate driving unit 105 in a layer-by-layer manner through the WOA 120. Thus, the power drive signal provided to the chip/integrated circuit through the type B trace 120b cannot have the serious distortion. In the actual use, however, since the WOA 120 between the gate driving units 105 (such as Gate to Gate, G-G) has an impedance, the longer the WOA 120 is, the greater the corresponding impedance value is, and this will show the signal climbing and amplitude. So in the design, the resistance value of the type B trace 120b for the chips/integrated circuits needs to be decreased.

Figure 2:
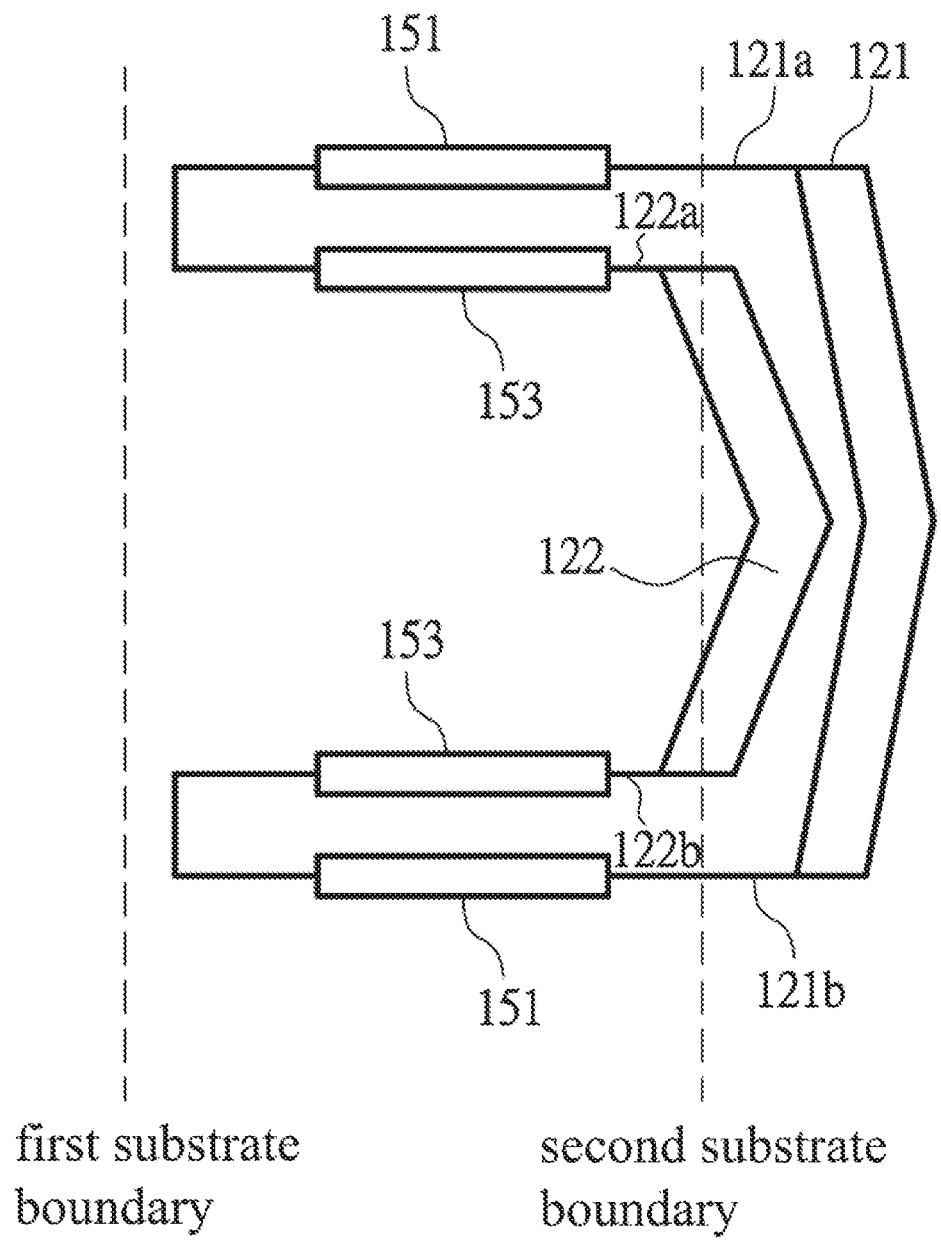
FIG. 2 is a schematic design view showing the type B trace of the display panel working in conjunction with the trace of the flexible circuit board according to an embodiment of this disclosure.

FIG. 2 is a schematic design view showing the type B trace of the display panel working in conjunction with the trace of the flexible circuit board according to an embodiment of this disclosure. Referring to FIG. 2, in an embodiment of this disclosure, a display panel 12 includes: a first substrate (not shown) including a display area and a wiring area, wherein a plurality of active switches and a plurality of pixel units are disposed on the display area of the first substrate, and the pixel units are coupled to the active switches, respectively; a second substrate (not shown) disposed opposite the first substrate; a first drive line portion 121 disposed in the wiring area of the first substrate and including a plurality of first circuit leads (121a, 121b); a second drive line portion 122 disposed in the wiring area of the first substrate and including a plurality of second circuit leads (122a, 122b); a first interface unit 151 respectively connected to the first circuit leads (121a, 121b); and a virtual bit interface unit 153 respectively connected to the second circuit leads (122a, 122b); wherein the first drive line portion 121 is mounted around the second drive line portion 122, the first interface unit 151 is connected to the virtual bit interface unit 153, so that the second drive line portion 122 is electrically coupled to the first drive line portion 121 to form parallel circuits.

In one embodiment, the first drive line portion 121 further includes a first pair of bit marks (not shown) to be connected to the first circuit leads (121a, 121b).

In one embodiment, the second drive line portion 122 further includes a second pair of bit marks (not shown) to be connected to the second circuit leads (122a, 122b).

In one embodiment, the material of the first pair of bit marks is selected from a group consisting of aluminum, molybdenum, chromium and alloys of aluminum, molybdenum and chromium.

In one embodiment, the material of the second pair of bit marks is selected from a group consisting of aluminum, molybdenum, chromium and alloys of aluminum, molybdenum and chromium.

In one embodiment, the edges of the second circuit leads (122a, 122b) include an active switch array.

Figure 5:
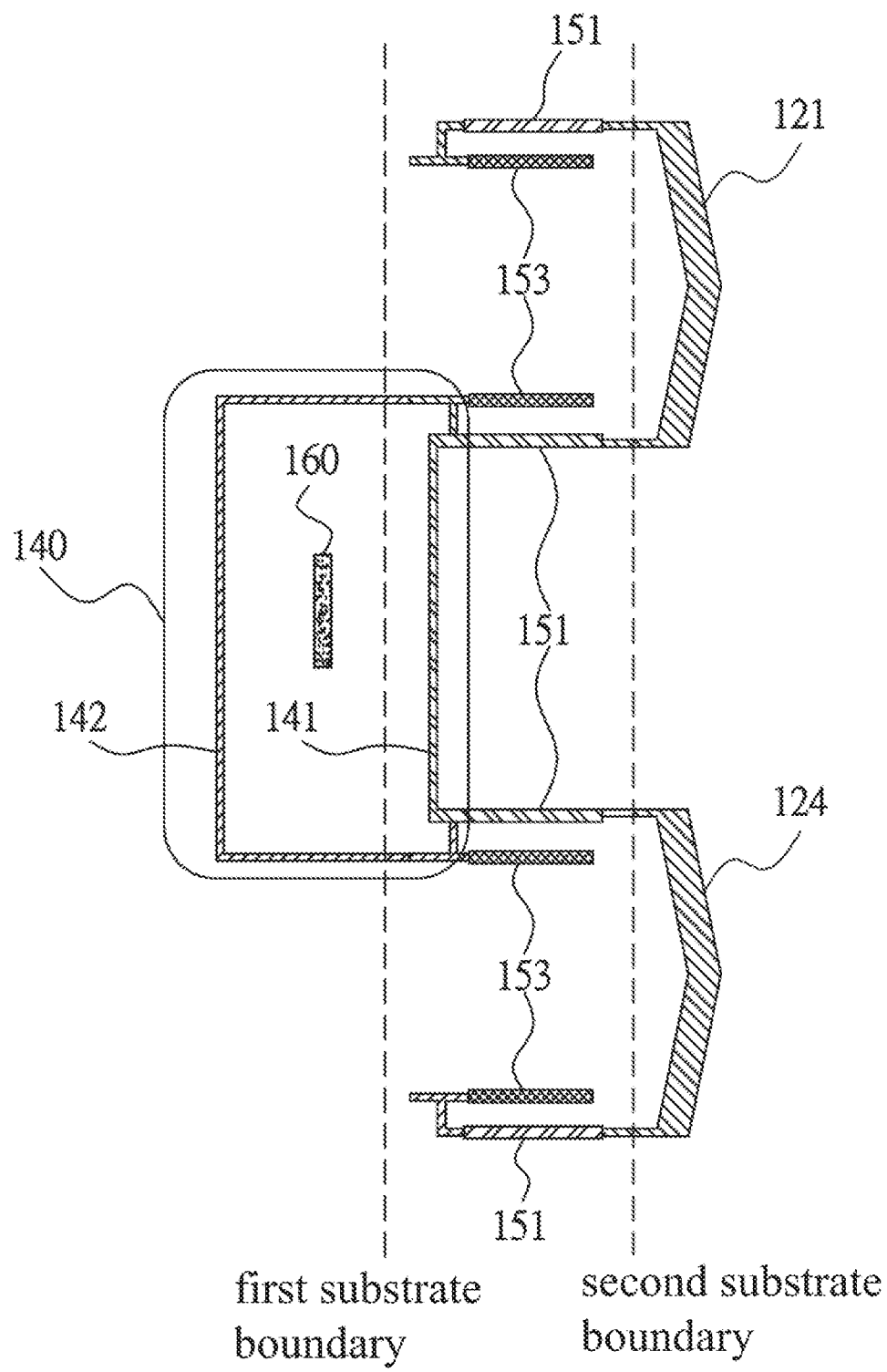
FIG. 5 is a schematic design view showing the type B trace of the display panel working in conjunction with the trace of the flexible circuit board according to an embodiment of this disclosure.

In one embodiment, the first circuit leads (121a, 121b) are connected to a drive chip 160 (FIG. 5).

In one embodiment, the drive chip 160 is a source drive chip.

In one embodiment, the drive chip 160 is a gate drive chip.

In one embodiment, the first interface unit 151 is disposed by way of single-layer metal wiring or dual-layer metal wiring.

In one embodiment, the virtual bit interface unit 153 is disposed by way of single-layer metal wiring or dual-layer metal wiring.

In one embodiment, the display panel further includes a third drive line portion 123 (FIG. 3a), and the third drive line portion 123 is respectively electrically coupled to a plurality of virtual bit interface units and the first interface unit.

In one embodiment, the third drive line portion 123 is disposed by way of single-layer metal wiring or dual-layer metal wiring.

The single-layer metal wiring method enables a display panel to prevent the influence of the outer frame or air to a maximum extent upon normal displaying. The dual-layer metal wiring can decrease the resistance value of the wire array to the maximum extent.

In one embodiment of the disclosure, a display panel includes: a first substrate (not shown), wherein a plurality of active switches and a plurality of pixel units are disposed on the first substrate; a second substrate (not shown) disposed opposite the first substrate; a first drive line portion 121 comprising a plurality of first circuit leads 121a, 121b; a second drive line portion 122 comprising a plurality of second circuit leads 122a, 122b; a first interface unit 151 respectively connected to the first circuit leads 121a, 121b and the second circuit leads 122a, 122b; and a virtual bit interface unit 153 respectively connected to the second circuit leads 122a, 122b and the second drive line portion 122. The first drive line portion 121 and the second drive line portion 122 are disposed on a wiring area of the first substrate. The first interface unit 151 is electrically coupled to the virtual bit interface unit 153, so that the first drive line portion 121 and the second drive line portion 122 form parallel circuits. An edge of the second substrate is disposed between the first drive line portion 121 and the first interface unit 151 and disposed between the second drive line portion 122 and the virtual bit interface unit 153. The first drive line portion 121 further comprises a first pair of bit marks to be connected to the first circuit leads 121a, 121b. The second drive line portion 122 further comprises a second pair of bit marks to be connected to the second circuit leads 122a, 122b. An edge of the second drive line portion 122 has an active switch array. The first interface unit 151 and the virtual bit interface unit 153 are electrically coupled to the first drive line portion 121 by way of single-layer or dual-layer metal wiring.

Figure 3A:
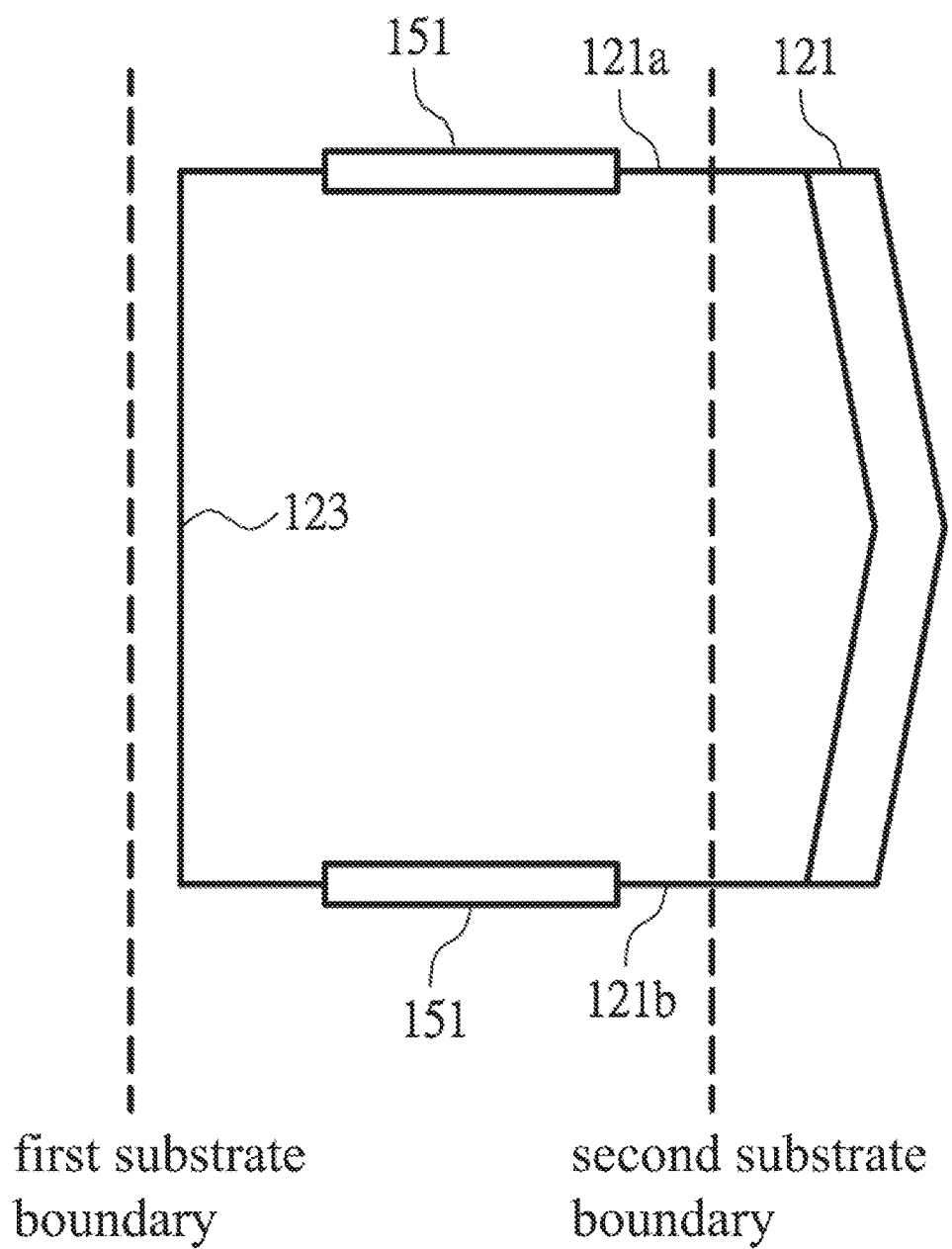
FIG. 3a is a schematic design view showing the type B trace of the display panel working in conjunction with the trace of the flexible circuit board according to an embodiment of this disclosure.

FIG. 3a is a schematic design view showing the type B trace of the display panel working in conjunction with the trace of the flexible circuit board according to an embodiment of this disclosure. In one embodiment of this disclosure, a display panel includes: a first substrate including a display area and a wiring area surrounding the display area, wherein a plurality of active switches and a plurality of pixel units are disposed in a display area of the first substrate, and the pixel units are respectively coupled to the active switches; a second substrate (not shown) disposed opposite the first substrate; and a first drive line portion 121 and a third drive line portion 123 disposed in the wiring area. The circuit leads of the third drive line portion 123 and the first drive line portion 121 are disposed in opposite directions. The third drive line portion 123 is respectively connected to the first interface unit 151, and is thus electrically coupled to the first drive line portion 121.

Figure 3B:
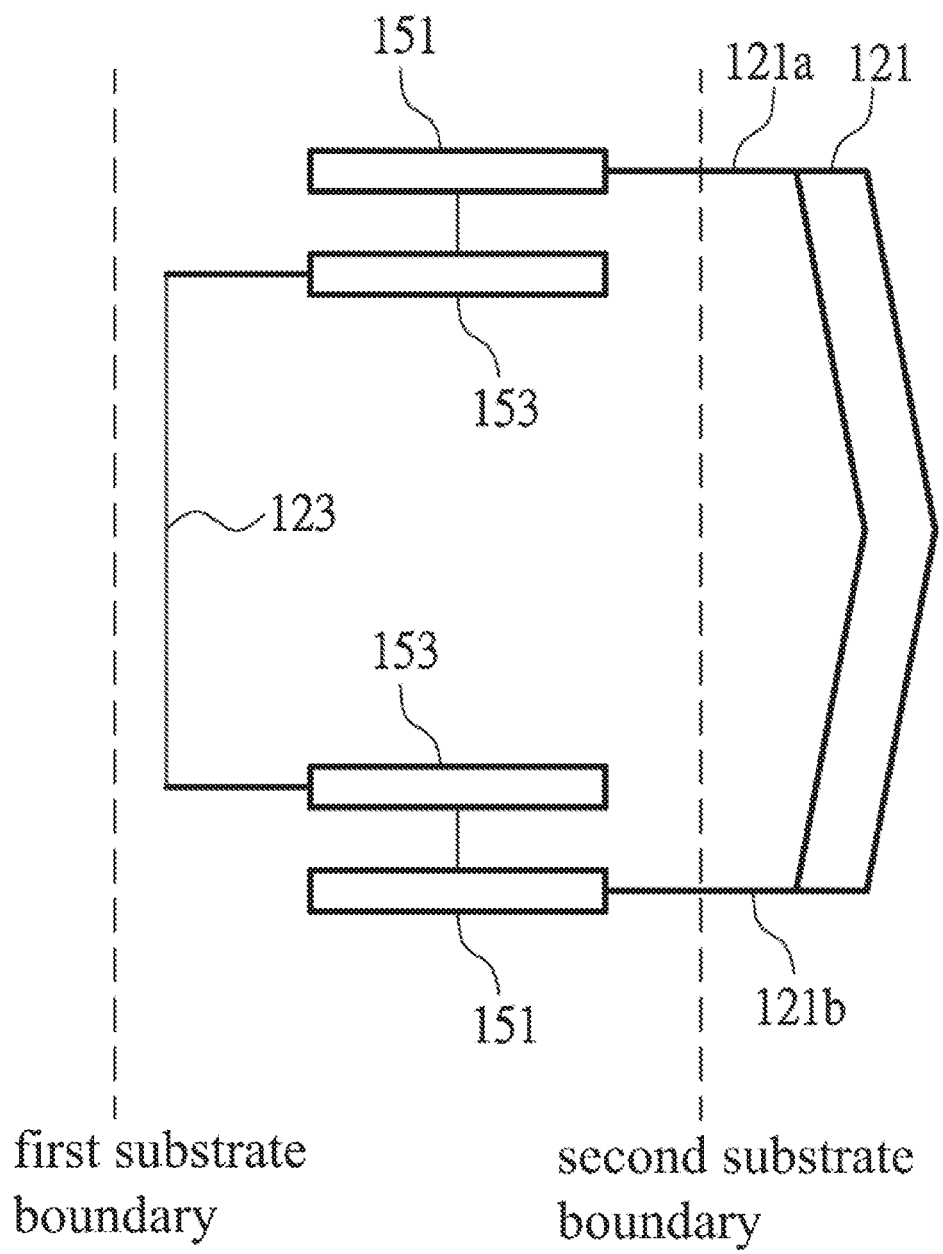
FIG. 3b is a schematic design view showing the type B trace of the display panel working in conjunction with the trace of the flexible circuit board according to an embodiment of this disclosure.

FIG. 3b is a schematic design view showing the type B trace of the display panel working in conjunction with the trace of the flexible circuit board according to an embodiment of this disclosure. In one embodiment of this disclosure, a display panel includes: a first substrate (not shown), wherein a plurality of active switches and a plurality of pixel units are disposed on the first substrates; a second substrate (not shown) disposed opposite the first substrate; and a first drive line portion 121 and a third drive line portion 123 disposed in the wiring area. The circuit leads of the third drive line portion 123 and the first drive line portion 121 are disposed in opposite directions. The first interface unit 151 is connected to the first drive line portion 121. The virtual bit interface unit 153 is connected to the third drive line portion 123. The first interface unit 151 is connected to the virtual bit interface unit 153, so that the third drive line portion 123 is electrically coupled to the first drive line portion 121.

Figure 4:
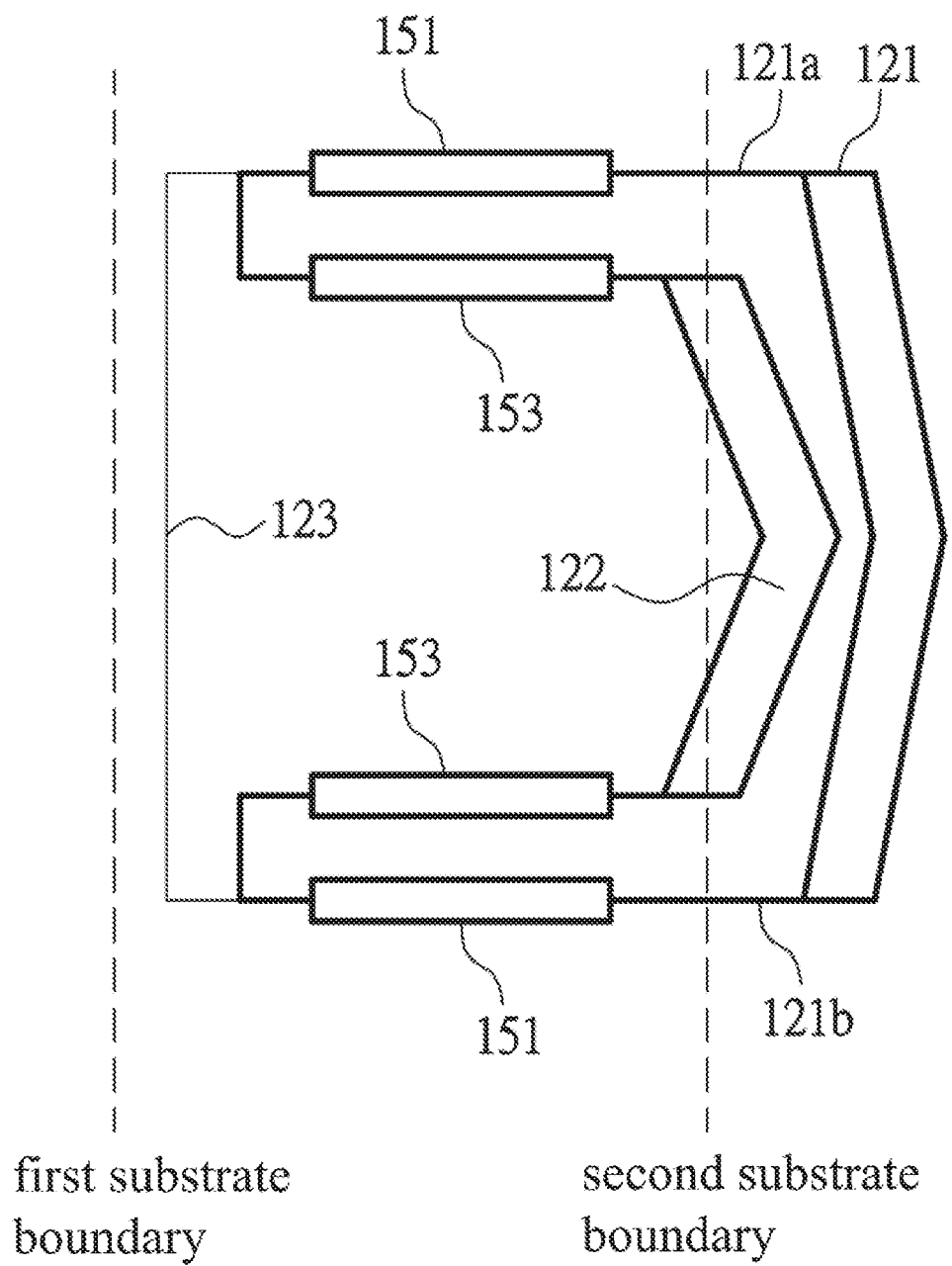
FIG. 4 is a schematic design view showing the type B trace of the display panel working in conjunction with the trace of the flexible circuit board according to an embodiment of this disclosure.

FIG. 4 is a schematic design view showing the type B trace of the display panel working in conjunction with the trace of the flexible circuit board according to an embodiment of this disclosure. In one embodiment of this disclosure, a display panel includes: a first substrate including a display area and a wiring area surrounding the display area, wherein a plurality of active switches and a plurality of pixel units are disposed in a display area of the first substrate, and the pixel units are respectively coupled to the active switches; a first drive line portion 121 and a second drive line portion 122 disposed in the wiring area; and a third drive line portion 123 electrically coupled to a plurality of virtual bit interface units 153 and the first interface unit 151. The first drive line portion 121 is electrically coupled to the first interface unit 151. The second drive line portion 122 is electrically coupled to the virtual bit interface unit 153, so that the second drive line portion 122 and the first drive line portion 121 form parallel circuits.

In some embodiments, the third drive line portion 123, the first interface unit 151 and the virtual bit interface unit 153 are disposed by way of single-layer metal wiring or dual-layer metal wiring.

FIG. 5 is a schematic design view showing the type B trace of the display panel working in conjunction with the trace of the flexible circuit board according to an embodiment of this disclosure. In one embodiment of this disclosure, a display panel includes: a first substrate including a display area and a wiring area surrounding the display area, wherein a plurality of active switches and a plurality of pixel units are disposed in a display area of the first substrate, and the pixel units are respectively coupled to the active switches; a second substrate disposed opposite the first substrate; a first drive line portion 121 and a fourth drive line portion 124 disposed in the wiring area of the first substrate; and a flexible circuit board 140 including a first wire 141, wherein the first wire 141 is electrically coupled to the first drive line portion 121 and the fourth drive line portion 124. The flexible circuit board 140 further includes a second wire 142, and the second wire 142 and the first wire 141 are connected in parallel to form parallel wires. Accordingly, the parallel wires serve as the extension wires of the first drive line portion 121 and the fourth drive line portion 124 to expand the line widths and areas of three of them. In addition, according to the parallel impedance principle of the parallel wires, the resistance value of the drive line portion can be relatively decreased in an assisted manner.

In some embodiments, the flexible circuit board 140 is a flexible printed circuit film or a flexible printed circuit board.

In some embodiments, the second wire 142 is electrically coupled to a plurality of virtual bit interface unit 153 and the first interface unit 151.

Figure 6:
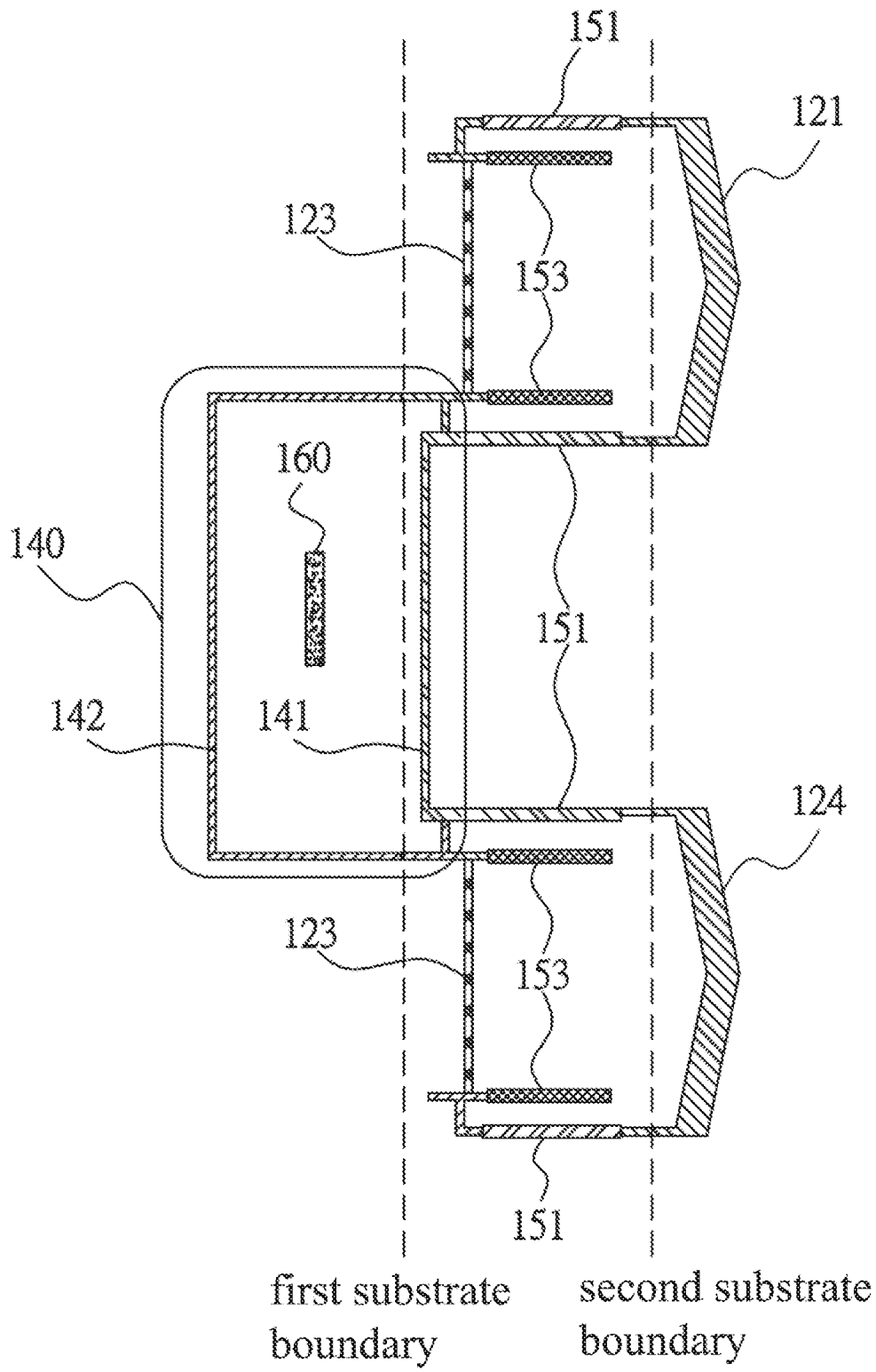
FIG. 6 is a schematic design view showing the type B trace of the display panel working in conjunction with the trace of the flexible circuit board according to an embodiment of this disclosure.

FIG. 6 is a schematic design view showing the type B trace of the display panel working in conjunction with the trace of the flexible circuit board according to an embodiment of this disclosure. In one embodiment of this disclosure, a display panel includes: a first substrate including a display area and a wiring area surrounding the display area, wherein a plurality of active switches and a plurality of pixel units are disposed in a display area of the first substrate, and the pixel units are respectively coupled to the active switches; a second substrate disposed opposite the first substrate; a first drive line portion 121, a second drive line portion 122 and a fourth drive line portion 124 disposed in the wiring area of the first substrate; a first interface unit 151 connecting the first drive line portion 121 to the third drive line portion 123; and a flexible circuit board 140 including a first wire 141 and a second wire 142. The first drive line portion 121 is electrically coupled to the fourth drive line portion 124 through the first wire 141. The second wire 142 and the first wire 141 are connected in parallel to form parallel wires.

Figure 7:
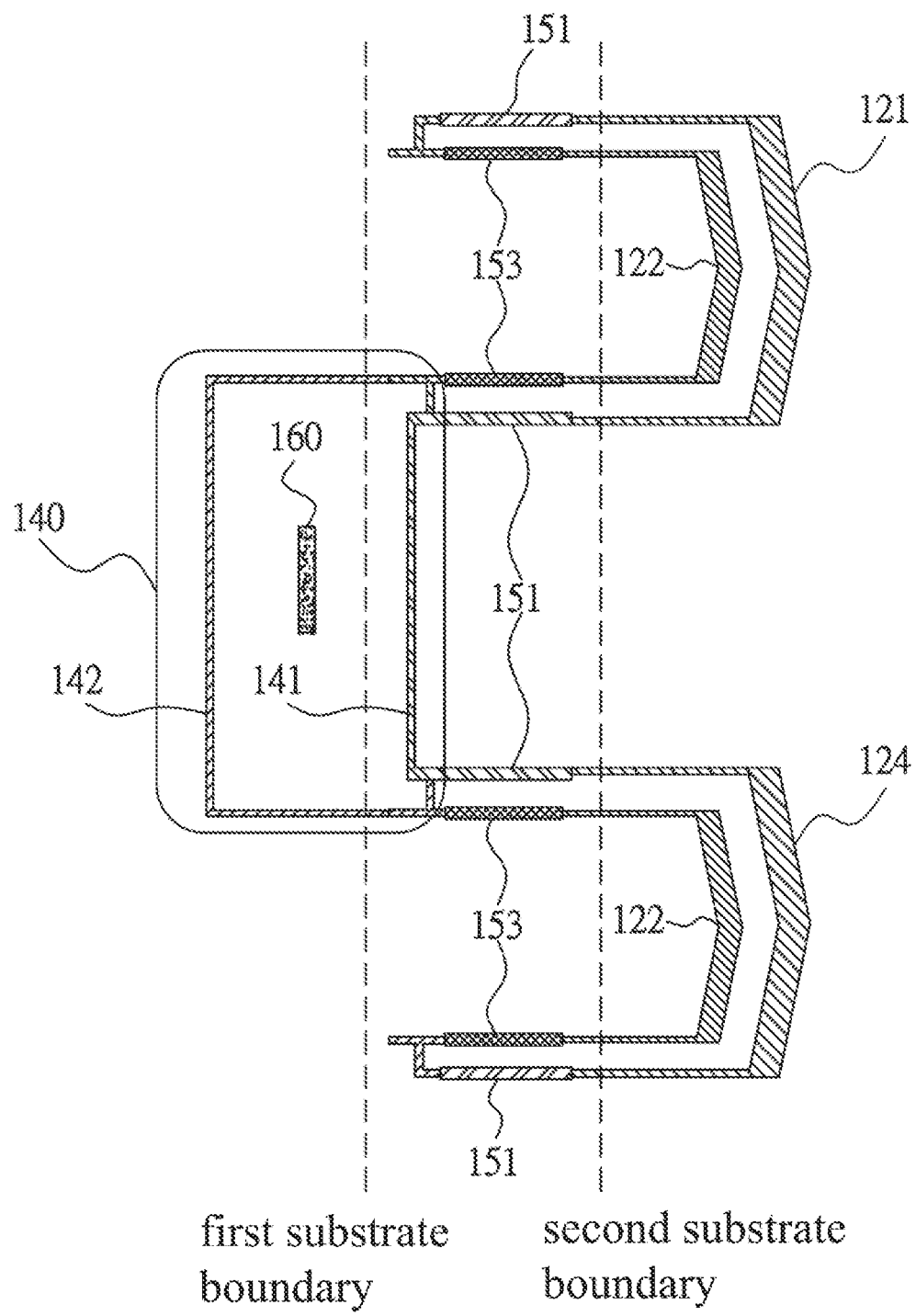
FIG. 7 is a schematic design view showing the type B trace of the display panel working in conjunction with the trace of the flexible circuit board according to an embodiment of this disclosure.

FIG. 7 is a schematic design view showing the type B trace of the display panel working in conjunction with the trace of the flexible circuit board according to an embodiment of this disclosure. In one embodiment of this disclosure, a display panel includes: a first substrate including a display area and a wiring area surrounding the display area, wherein a plurality of active switches and a plurality of pixel units are disposed in a display area of the first substrate, and the pixel units are respectively coupled to the active switches; a first drive line portion 121, a second drive line portion 122 and a fourth drive line portion 124 disposed in the wiring area of the first substrate; a flexible circuit board 140 including a first wire 141 and a second wire 142, wherein the second wire 142 and the first wire 141 are connected in parallel to form parallel wires; and a first interface unit 151 electrically coupling the first drive line portion 121 and the fourth drive line portion 124 to a plurality of virtual bit interface units 153. The second drive line portion 122 is electrically coupled to the virtual bit interface units 153, so that the first drive line portion 121 and the fourth drive line portion 124 are connected to form parallel wires.

Figure 8:
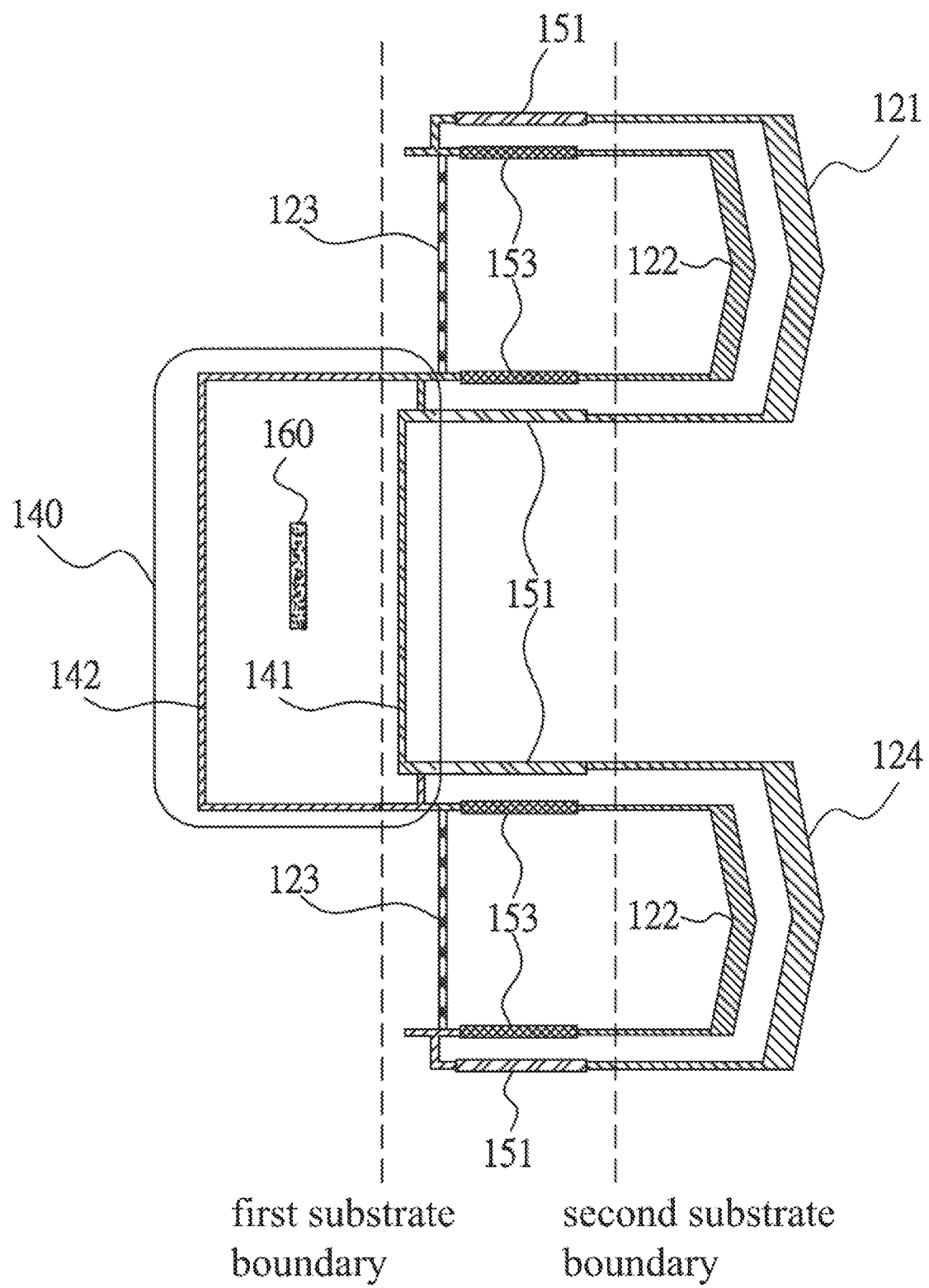
FIG. 8 is a schematic design view showing the type B trace of the display panel working in conjunction with the trace of the flexible circuit board according to an embodiment of this disclosure.

FIG. 8 is a schematic design view showing the type B trace of the display panel working in conjunction with the trace of the flexible circuit board according to an embodiment of this disclosure. In one embodiment of this disclosure, a display panel includes: a first substrate including a display area and a wiring area surrounding the display area, wherein a plurality of active switches and a plurality of pixel units are disposed in a display area of the first substrate, and the pixel units are respectively coupled to the active switches; a first drive line portion 121 and a fourth drive line portion 124 disposed in the wiring area of the first substrate; and a flexible circuit board 140 including a first wire 141 and a second wire 142, wherein the second wire 142 and the first wire 141 are connected in parallel to form parallel wires. The first wire 141 respectively connects to the first drive line portion 121 and the fourth drive line portion 124. The first drive line portion 121 and the fourth drive line portion 124 are electrically coupled to the third drive line portion 123 and the virtual bit interface units 153, respectively, through the first interface unit 151. The second drive line portion 122 is electrically coupled to the virtual bit interface units 153 to respectively form parallel circuits together with the first drive line portion 121 and the fourth drive line portion 124. The third drive line portion 123 is disposed between the virtual bit interface units 153.

Referring to FIGS. 2 to 8, in one embodiment, a display device includes a control component and a display panel of one of the above embodiments.

Figure 9:
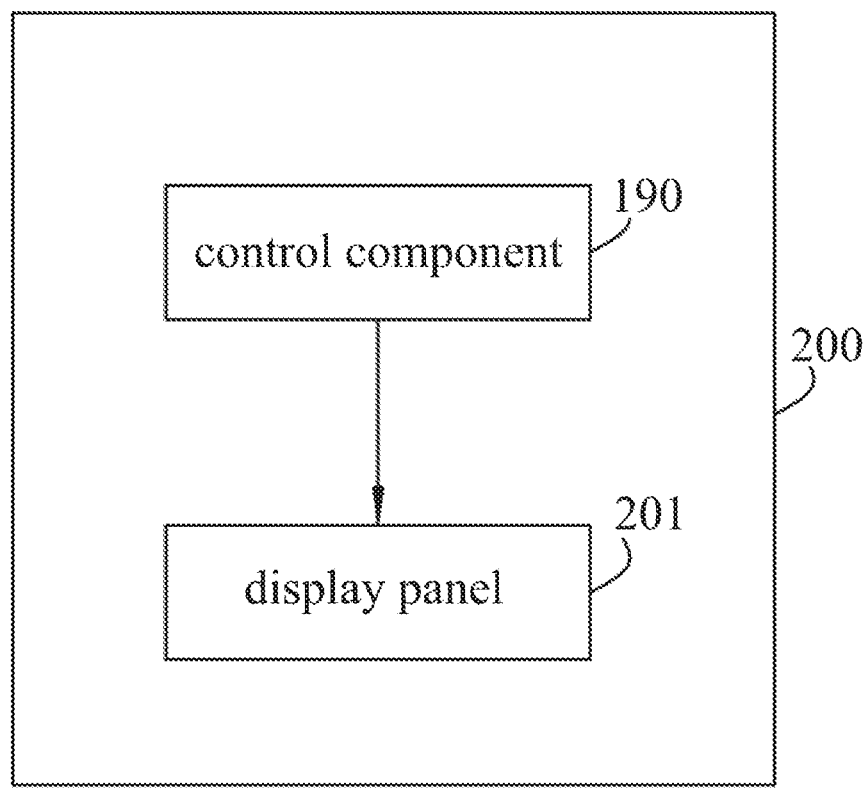
FIG. 9 is a schematic architecture view showing a display device according to an embodiment of this disclosure.

FIG. 9 is a schematic architecture view showing a display device according to an embodiment of this disclosure. Referring to FIGS. 2 to 8, a display device 200 in one embodiment of this disclosure includes: a control component 190 transmitting a common voltage, a drive power and a work signal through transmission wire, wherein the control component 190 includes, for example but without limitation to, the previously described timing module, source driving unit 104 and gate driving unit 105; and a display panel 201 of any of the above embodiments.

In some embodiments, the display panel of this disclosure can be, for example, a liquid crystal display panel, but this disclosure is not limited thereto. The display panel of this disclosure can also be an OLED display panel, a W-OLED display panel, a QLED display panel, a plasma display panel, a curved display panel, or any other kinds of display panels.

This disclosure can decrease the resistance value of the type B trace of the WOA in the narrow border, enhancing the product quality and the product reliability, and lengthening the lifetime.

The terms "in some embodiments" and "in various embodiments" are used repeatedly. The terms generally do not refer to the same embodiment; but it may also refer to the same embodiment. The words "include", "possess" and "comprise" are synonyms, unless its contexts show other meanings.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display panel, comprising:
   a first substrate including a display area and a wiring area, wherein a plurality of active switches and a plurality of pixel units are disposed in the display area of the first substrate, and the pixel units are respectively coupled to the active switches;
   a second substrate disposed opposite the first substrate;
   a first drive line portion disposed in the wiring area of the first substrate, wherein the first drive line portion comprises a plurality of first circuit leads;
   a second drive line portion disposed in the wiring area of the first substrate, wherein the second drive line portion comprises a plurality of second circuit leads;
   a plurality of first interface units respectively connected to the first circuit leads;
   a plurality of virtual bit interface units respectively connected to the second circuit leads; and a third drive line portion, wherein the third drive line portion is respectively electrically coupled to the virtual bit interface units and the first interface units;

wherein, the first drive line portion is mounted around the second drive line portion, and each of the first interface units is connected to each of the virtual bit interface units, so that the second drive line portion is electrically coupled to the first drive line portion to form parallel circuits.

2. The display panel according to claim 1, wherein each of the first interface units is disposed by way of single-layer metal wiring or dual-layer metal wiring.

3. The display panel according to claim 1, wherein each of the virtual bit interface units is disposed by way of single-layer metal wiring or dual-layer metal wiring.

4. The display panel according to claim 1, wherein the third drive line portion is disposed by way of single-layer metal wiring or dual-layer metal wiring.

5. The display panel according to claim 1, wherein the first circuit leads are connected to a drive chip.

6. The display panel according to claim 5, wherein the drive chip is a source drive chip.

7. The display panel according to claim 5, wherein the drive chip is a gate drive chip.

8. The display panel according to claim 1, further comprising:
a fourth drive line portion disposed in the wiring area of the first substrate; and
a flexible circuit board including a first wire, wherein the first wire is electrically coupled to the first drive line portion and the fourth drive line portion.

9. The display panel according to claim 8, wherein the flexible circuit board further comprises a second wire, and the second wire and the first wire are connected in parallel to form parallel wires.

10. The display panel according to claim 8, wherein the flexible circuit board is a flexible printed circuit film or a flexible printed circuit board.

11. The display panel according to claim 1, further comprising:
a fourth drive line portion disposed in the wiring area of the first substrate, wherein one of the first interface units connects the first drive line portion to the third drive line portion; and
a flexible circuit board including a first wire and a second wire, wherein the second wire and the first wire are connected in parallel to form parallel wires, and the first drive line portion is electrically coupled to the fourth drive line portion through the first wire.

12. The display panel according to claim 1, further comprising:
a fourth drive line portion disposed in the wiring area of the first substrate; and
a flexible circuit board including a first wire and a second wire, wherein the second wire and the first wire are connected in parallel to form parallel wires, the first interface units electrically couples the first drive line portion and the fourth drive line portion to the virtual bit interface units, and the second drive line portion is respectively electrically coupled to the virtual bit interface units to respectively form parallel circuits together with the first drive line portion and the fourth drive line portion.

13. The display panel according to claim 1, further comprising:
a fourth drive line portion disposed in the wiring area of the first substrate; and
a flexible circuit board including a first wire and a second wire, wherein the second wire and the first wire are connected in parallel to form parallel wires, the first wire is respectively connected to the first drive line portion and the fourth drive line portion, the first drive line portion is respectively electrically coupled to the third drive line portion and the virtual bit interface units through the first interface units, the second drive line portion is respectively electrically coupled to the virtual bit interface units to respectively form parallel circuits together with the first drive line portion and the fourth drive line portion, and the third drive line portion is disposed between the virtual bit interface units.

14. The display panel according to claim 1, wherein an edge of the second drive line portion has an active switch array.

15. A display panel, comprising:
a first substrate including a display area and a wiring area, wherein a plurality of active switches and a plurality of pixel units are disposed in a display area of the first substrate, and the pixel units are respectively coupled to the active switches;
a second substrate disposed opposite the first substrate;
a first drive line portion disposed in the wiring area of the first substrate, wherein the first drive line portion comprises a plurality of first circuit leads;
a second drive line portion disposed in the wiring area of the first substrate, wherein the second drive line portion comprises a plurality of second circuit leads;
a plurality of first interface units respectively connected to the first circuit leads; and
a plurality of virtual bit interface units respectively connected to the second circuit leads;
wherein the first drive line portion is mounted around the second drive line portion; the first circuit leads and the second circuit leads are extendingly disposed in a same direction toward an edge of the first substrate; and each of the first interfaces unit is electrically coupled to each of the virtual bit interface units, so that the first drive line portion and the second drive line portion form parallel circuits;
wherein an edge of the second substrate is disposed between the first drive line portion and the first interface units and disposed between the second drive line portion and the virtual bit interface units;
wherein the first drive line portion further comprises a first pair of bit marks to be connected to the first circuit leads;
wherein the second drive line portion further comprises a second pair of bit marks to be connected to the second circuit leads;
wherein an edge of the second drive line portion has an active switch array;
wherein each of the first interface units and each of the virtual bit interface units are electrically coupled to the first drive line portion by way of single-layer or dual-layer metal wiring.

16. The display panel according to claim 15, wherein materials of the first pair of bit marks and the second pair of bit marks are selected from a group consisting of aluminum, molybdenum, chromium and alloys of aluminum, molybdenum and chromium.

17. The display panel according to claim 15, wherein materials of the first interface units and the virtual bit interface units are selected from a group consisting of aluminum, molybdenum, chromium and alloys of aluminum, molybdenum and chromium.

18. A display device, comprising:
a control component; and
a display panel connected to the control component and comprising:
a first substrate including a display area and a wiring area, wherein a plurality of active switches and a plurality of pixel units are disposed in the display area of the first substrate, and the pixel units are respectively coupled to the active switches;
a second substrate disposed opposite the first substrate;
a first drive line portion disposed in the wiring area of the first substrate, wherein the first drive line portion comprises a plurality of first circuit leads;
a second drive line portion disposed in the wiring area of the first substrate, wherein the second drive line portion comprises a plurality of second circuit leads;
a plurality of first interface units respectively connected to the first circuit leads;
a plurality of virtual bit interface units respectively connected to the second circuit leads; and
a third drive line portion, wherein the third drive line portion is respectively electrically coupled to the virtual bit interface units and the first interface units;
wherein the first drive line portion is mounted around the second drive line portion, and each of the first interface units is connected to each of the virtual bit interface units, so that the second drive line portion is electrically coupled to the first drive line portion to form parallel circuits.

* * * * *